United States Patent [19]
Suzue et al.

[11] Patent Number: 6,088,947
[45] Date of Patent: *Jul. 18, 2000

[54] MEMBER FOR FISHING OR SPORT TOOL

[75] Inventors: Hiroyasu Suzue; Mamoru Koike, both of Saitama; Eiji Sugaya; Mitsuo Imai, both of Tokyo, all of Japan

[73] Assignee: Daiwa Seiko, Inc., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/884,334

[22] Filed: Jun. 27, 1997

[51] Int. Cl.[7] .............................. A01K 87/00; A63B 53/10

[52] U.S. Cl. ......................... 43/18.1; 280/819; 473/319; 473/320; 428/378

[58] Field of Search ............................. 43/18.1; 280/819; 473/318–321; 428/378, 398

[56] References Cited

U.S. PATENT DOCUMENTS

| | | | |
|---|---|---|---|
| 4,178,713 | 12/1979 | Higuchi | 43/18 |
| 5,242,720 | 9/1993 | Blake | 428/34.5 |
| 5,265,911 | 11/1993 | Goode | 280/819 |
| 5,338,604 | 8/1994 | Yasui | 428/36.3 |
| 5,458,372 | 10/1995 | Goode | 280/819 |
| 5,718,792 | 2/1998 | Goode | 156/228 |
| 5,721,030 | 2/1998 | Okada | 428/36.3 |

*Primary Examiner*—Jack W. Lavinder
*Attorney, Agent, or Firm*—Liniak, Berenato Lonagacre & White

[57] ABSTRACT

In order to provide a member for a fishing or sport tool with light weight property and excellent exterior, the member is constructed by a body; a film formed directly on the body of the member or through an intermediate layer; and a single-color forming coating film formed on the outside of the film and capable of transmitting or reflecting only components in a wavelength region included in a specific range among incident light beams.

13 Claims, 7 Drawing Sheets

MEMBER FOR FISHING OR SPORT TOOL

BACKGROUND OF THE INVENTION

The present invention relates to a member having a decoration layer for use in a fishing tool including a fishing rod, a reel, a lure, a tackle box, a consort ship and small articles, a shaft and a head of a golf club, a tennis racket, a badminton racket, a frame of a bicycle and the like. The present invention also relates to a light-weight member for a fishing tool or a spool tool.

Fishing tools and sport tools are decorated variously to attract interests of users. Therefore, the member for use in the tool has a variety of decoration layers. In recent years, reduction of the weight of the fishing tool and the sport tool results in the ratio of the weight of a coating layer with respect to that of the tool being raised. Specifically, the weight of the coating layer of a fishing rod with respect to the weight of the pole has been raised to 5% to 10% or higher. Therefore, the coating layer and the decoration layer prevent the weight reduction of the fishing tool and the sport tool. Accordingly, a member having a thin metal layer as a decoration layer thereof has been disclosed in Japanese Patent Laid-Open No. 7-79669.

However, the foregoing thin metal layer has luster peculiar to the metal as the exterior thereof and it cannot express the texture or the like as the exterior thereof.

If a metal color is required to be expressed in a portion of the member, an element made of, for example, aluminum, brass or stainless steel must be attached by bonding or press-fitting. If the metal element is attached, a stepped portion is generated in the boundary from the metal element, thus resulting in that the member loses the sense of integration. Moreover, burrs in the edge portion of the metal element have a risk of injuring the hand.

Moreover, the weight of the member is enlarged and, thus, also the weight of sport tool using the member is enlarged. The foregoing fact is an undesirable fact because reduction of the weights of the sport tools, such as fishing tools, golf tools, skiing tools and tennis tools, is required.

In view of the foregoing, an object of the present invention is to provide a member having a decoration layer exhibiting excellent exterior and light weight.

Further, a technology is available in which a metal film, a ceramic film and the like serving as decoration layers are formed on the body of the member through a synthetic resin coating film, such as a coating layer.

However, since the metal film and the ceramic film have hardness greater than that of the body of the member and that of the synthetic resin coating film, they cannot follow deformation of the body of the member and the synthetic resin coating film. Thus, there arises a problem in that they are separated from the body of the member and the synthetic resin coating film and they are destroyed.

In view of the foregoing, another object of the present invention is to provide a member for a fishing or sport tool having a decoration layer free from separation and destruction and thus having light weight and excellent exterior.

A structure has been disclosed in Japanese Patent Laid-Open No. 7-31337 in which the surface of a pipe shape member is coated and thus smoothed, and then a thin interference film is formed on the smoothed surface so that the thin interference film causes interference of light to take place in a state where light is made incident to thereby make the pipe shape member colorful.

However, in case where the thin coherent film is formed on a reel, which is not the pipe shape, by the above-mentioned method, the formed color is only observed in a limited condition where the eyes are directed in specific direction with respect to the incident light beam, and the color formed by the interference cannot be visually recognized from an arbitrary position. Therefore, the color forming effect is insufficient.

Accordingly, another object of the present invention is to provide an article having an interference coating film which causes a color formed by interference of light to be visually recognized from any direction without limitation to a specific direction.

Since a fishing tool and a sport tool for use in outdoors, in particular, the fishing tool is frequently brought into contact with water drops, its surface is subjected to a water repellent process to easily remove water drops allowed to adhere to the same.

A conventional member subjected to the water repellent process has a structure arranged such that a decoration coating layer made of epoxy resin, urethane resin or acrylic resin is formed on a base made of fiber reinforced prepreg, polyamide resin or Al diecast; and a water repellent coating layer is formed on the decoration coating layer with a fluorine or silicon type coating medium by spray coating or die coating. In this case, the thickness of the decoration coating layer and the water repellent coating layer is 5 $\mu$m to tens of $\mu$m.

However, the water repellent coating layer formed by spraying-coating or die-coating the fluorine or silicon coating medium is too thick and non-uniform. If the water repellent coating layer is too thick, the ratio of the weight of the coating layer with respect to the overall weight of the rod is raised excessively in a case of a fishing rod. Thus, reduction of the weight of the fishing rod cannot be performed as desired. If the water repellent coating layer is too thick and non-uniform, for example, a reel encounters a problem in that the accurate dimensions cannot be obtained.

In view of the foregoing, another object of the present invention is to provide a water repellent member having a water repellent layer having a small and uniform thickness.

SUMMARY OF THE INVENTION

According to one aspect of the present invention, there is provided a member for a fishing or sport tool, comprising: a body of the member; a film formed directly on the body of the member or through an intermediate layer; and a single-color forming coating film (or a monochromatic radiation generating film) formed on the outside of the film and capable of transmitting or reflecting only components in a wavelength region included in a specific range among incident light beams.

The member for a fishing or sport tool having the above-mentioned structure has the body of the member made of synthetic resin, such as polyamide resin, glass fiber reinforced polyamide resin, ABS (acrylonitrile-butadiene-styrene) resin, glass fiber reinforced ABS resin or polycarbonate resin; fiber reinforced prepreg prepared by impregnating synthetic resin, such as epoxy resin, phenol resin or polyester into reinforced fiber, such as carbon fiber, glass fiber, alumina fiber or aramide fiber; metal, such as aluminum alloy, magnesium alloy or titanium alloy; or ceramics such as zirconium oxide, aluminum oxide, silicon carbide or silicon nitride.

The film formed directly on the body of the member or through an intermediate layer specifically means a metal film or a ceramic film using reflectance of metal or ceramics to adjust the brightness and the saturation of color appearing as the exterior so as to cover the body of the member and the ground layer. Metal forming the metal film is exemplified by Al, Cu, Ag, Mg, In, Cr, Si, Ni, Au, Rh, Pt and the like. As the ceramics forming the ceramic film is exemplified by TiN, TiC, CrCN, TiAlN, DLC (diamond-like carbon), $Al_2O_3$, SiC, $Si_3N_4$, ZrC and the like. By using, Cr, stainless steel, Ni or the like as the material for forming the metal film, the color appearing as the exterior can be made to be brighter than the color obtained from only the coating layer. Moreover, the corrosion resistance can be improved.

The metal film may be composed of a plurality of films made of the above-mentioned materials. By combining the plural films, a variety of hues can easily be expressed. When, for example, blue type color is expressed on the exterior, it is preferable that metal films be formed directly on the body of the member or through an intermediate layer in a sequential order as a Ni film and a Ti film. When yellow type color is expressed on the exterior, it is preferable that metal films be formed directly on the body of the member or through an intermediate layer in a sequential order as a Cr film and a Ti film. As a result, bright blue or yellow can be expressed.

It is preferable that the thickness of the metal film be 2 nm to 20 μm in order to obtain bright color and to cover the ground. It is more preferably that the thickness be 2 nm to 50 nm.

The single-color forming coating film has a characteristic to transmit or reflect only components in a wavelength region included in a specific range among incident light beams. That is, the foregoing coating film has a characteristic to receive plural-color light beams and form a single color (the same color tone). Specifically, it receives plural-color light beams, such as white light beam, and forms a single color, such as blue, violet, green, yellow-green, yellow, red, pink or the like. The hue can be changed by adjusting the thickness of the coating film. In particular, blue having a wavelength of 450 nm to 490 nm and yellow having a wavelength of 560 nm to 590 nm do not sensitively react to non-uniformity in the thickness of the film so that stable single colors are formed.

The single-color forming coating film may be made of a material exemplified by SiO, $SiO_2$, $In_2O_3$, $TiO_2$, $SnO_2$, $MgF_2$, $Al_2O_3$, $Cr_2O_3$ and ZnS. The single-color forming coating film may be formed by plural films made of the above-mentioned materials. Since the single-color forming coating film reflects components in specific wavelengths to express a color, it is preferable that the material be transparent or semitransparent.

It is preferable that the thickness of the single-color forming coating film satisfies a value obtained by dividing odd number times of the ¼ optical thickness of the wavelength of a required color as the exterior by a refraction factor, that is, it satisfies $(2m+1)\cdot\lambda/4=nd$ ($\lambda$: wavelength, n: refraction factor, d: thickness and m: an integer). As a result, an interference effect is intensified and thus the color is made to be brighter. When, for example, blue having a wavelength of 450 nm to 490 nm is formed, it is preferable that nd be odd number times of 112.5 nm to 122.5 nm which is $\lambda/4$. When yellow having a wavelength of 560 nm to 590 nm is formed, it is preferable that nd be odd number times of 140 nm to 147.5 nm which is $\lambda/4$. When red having a wavelength of about 700 nm is formed, it is preferable that nd be odd number times of about 175 nm which is $\lambda/4$.

The thickness of the single-color forming coating film may be set to be a value obtained by dividing even number times of the ½ optical thickness of the wavelength of a required color as the exterior by the refraction factor, that is, it satisfies $2m\cdot\lambda/2=nd$. As a result, the interference effect is suspended so that the color of the ground is easily obtained viewable, dull-hued color is expressed and thus impressive exterior is expressed.

It is preferable that the single-color forming coating film be formed to have a substantially uniform thickness, that is, non-uniformity of the thickness falls within 5 nm to 50 nm. By adjusting the non-uniformity of the thickness of the single-color forming coating film, plural color light beams can be received and single color can be formed. Thus, rainbow color is not formed on the exterior attributable to the interference.

A method of forming the above-mentioned metal film, the ceramic film and the single-color forming coating film is exemplified by a PVD (Physical-Vapor Deposition) method including a vacuum evaporation method, a sputtering method, an ion plating method; a CVD (Chemical Vapor Deposition) method including a P-CVD (Plasma CVD), MOCVD (Metal Organic CVD); and a wet plating method.

An intermediate layer, such as a coating layer or a printed layer, may be formed between the body of the member and the metal film or the ceramic film. Another intermediate layer, such as a protective layer, a primer layer or a wavy pattern layer, made of synthetic resin or an inorganic material, may be formed between the metal film and the single-color forming coating film.

A transparent or semitransparent protective layer made of an organic silicon compound, such as SiO, $SiO_2$, $MgF_2$, $AlF_3$, $BaF_2$, $CaF_2$, $ZrO_2$, polysiloxane, polydimethylsiloxane; or fluororesin such as polytetrafluoroethylene or perfluoroalkylacrylate, that is, a layer realizing wear resistance, water repellency, abrasion resistance and the like may be formed on the single-color forming coating film. In this case, it is preferable that the thickness of the protective layer be 2 nm to 500 nm in consideration of satisfactorily forming the required color and preventing an adverse influence on the color of the single-color forming coating film.

A hard protective layer made of ceramics, such as TiC, TiN, SiC, $Al_2O_3$, CrCN, TiAlN, $Si_3N_4$, ZrC or DLC may be directly formed on the body of the member or through an intermediate layer, such as a coating layer or a printed layer. As a result, the wear resistance can be improved with a thin protective layer.

The above-mentioned protective layer can be formed by the foregoing PVD method or the CVD method.

According to another aspect of the present invention, there is provided a member having a decoration layer, comprising: a body of the member; a thin metal layer formed directly on the body of the member or through a ground layer and having such a small thickness as to permit the color of the body of the member or the ground layer to be expressed as the exterior; and a transparent or semitransparent protective layer formed on the metal layer.

According to another aspect of the present invention, there is provided a member having a decoration layer, comprising: a body of the member; a metal layer formed directly on the body of the member or through a ground layer; and a protective layer formed on the metal layer arranged to inhibit the color of the metal layer to appear as the exterior and permit reflection by the metal layer to be expressed as the exterior.

Further, in consideration of the relationship between the metal film (or the ceramic film), which is a decoration layer, and the ground, it was found out that a decoration layer free from separation and destruction and capable of providing excellent exterior can realized by reduction of the difference between the characteristics of the decorative layer and the those of the ground or considerable reduction of the thickness of the decoration layer, to be about 10 μm or smaller.

That is, according to another aspect of the present invention, there is provided a member for a fishing or sport tool, comprising: a body of the member; a synthetic resin coating film formed on the body of the member; and a thin decorating film formed on the synthetic resin coating film, wherein the synthetic resin coating film has characteristics approximating characteristics of the thin decorating film.

Further, there is provided a member for a fishing or sport tool comprising: a body of the member; and a hard coating film having a thickness smaller than 10 μm.

Furthermore, there is provided a member for a fishing or sport tool comprising: a body of the member; a synthetic resin coating film formed on the body of the member; a hard coating film formed on the synthetic resin coating film; and a thin decorating film formed on the hard coating film.

According to another aspect of the present invention, there is provided an arrangement which is characterized by a fine wavy surface arranged to reflect light and formed on the surface of the article; a transparent layer formed on the fine-wavy surface and having such a thickness as to cause interference or interaction of light to provide the smooth surface; and a transparent coating film formed on the smooth surface, made of a material different from a material of the transparent layer and having such a thickness as to cause interference or interaction of light. The term "transparent" in this specification includes a transparent-like state as well as the completely transparent state.

Further, there is provided an arrangement which is characterized by a layer having a transparent layer, in which a multiplicity of small metallic members are dispersed, and formed on the surface of the article; and a transparent coating film formed on the layer and having such a thickness as to cause interference or interaction of light.

In the former arrangement, the incident light reflects on the outer surface of the transparent coating film causing the interference of light, on the interface between the transparent coating film and the transparent layer causing the interference of light and on the interface between the transparent layer and the small wavy surface. Thus, composite interference of light reflected by the three portions forms a color. The existence of the small wavy surface for reflecting light into random directions enables a formed color to be visually recognized from any direction without a limitation to a specific direction.

With the latter arrangement, the incident light reflects on the outer surface of the transparent coating film causing interference of light, on the interface between the transparent coating film and the layer having a multiplicity of dispersed small metallic members and on the small metallic members in the layer. Thus, composite interference of light reflected by the three portions forms a color. The existence of the multiplicity of the small metallic members for reflecting light into random directions enables a formed color to be visually recognized from any direction without a limitation to a specific direction.

The fact that formed color can be visually recognized from any direction was confirmed in experiments.

According to another aspect of the present invention, there is provided a water repellent member comprising a base and a water repellent layer formed on the base, wherein a region having a thickness of smaller than 1 μm and formed by a chemical bond is formed between the base and the water repellent layer.

It is preferable that an intermediate layer be formed between the base and the water repellent layer. Specifically, the intermediate layer is a layer containing a silicon oxide, and the water repellent layer is a layer containing an organic silicon compound or the water repellent layer is a layer formed by fluororesin.

According to another aspect of the present invention, there is provided a fishing rod comprising a pipe shape member and a water repellent layer formed on the pipe shape member, wherein a region having a thickness of smaller than 1 μm and formed by of a chemical bond is formed between the base and the water repellent layer.

According to the present invention, there is provided a member for a fishing or sport tool, comprising:

a body; and a plurality of metal coating films formed by vapor-depositing metal around said body so as to be arranged one on another, wherein a specific gloss is generated from said member through interaction of lights reflected from the plurality of metal coating films.

According to the present invention, there is provided a member for a fishing or sport tool, comprising:

a body; and a metal layer formed by vapor-depositing metal around the body and formed of a metal material having an inherent gloss, wherein a specific gloss different in hue and chromaticness from the inherent gloss is generated through interaction of lights reflected from the body and metal layer.

According to the present invention, there is provided a member for a fishing or sport tool, comprising:

a body having a gloss; and a transparent metal layer formed by vapor-depositing metal around the body, so that the gloss of the body is viewable through the transparent metal layer.

According to the present invention, there is provided a member for a fishing or sport tool, comprising:

a body; and an anode oxide thin layer physical-vapor-deposited around said body.

DETAILED DESCRIPTION OF THE PREFERRED EMBODIMENTS

Embodiments of the present invention will specifically be described with reference to the drawings.

Figure 1:
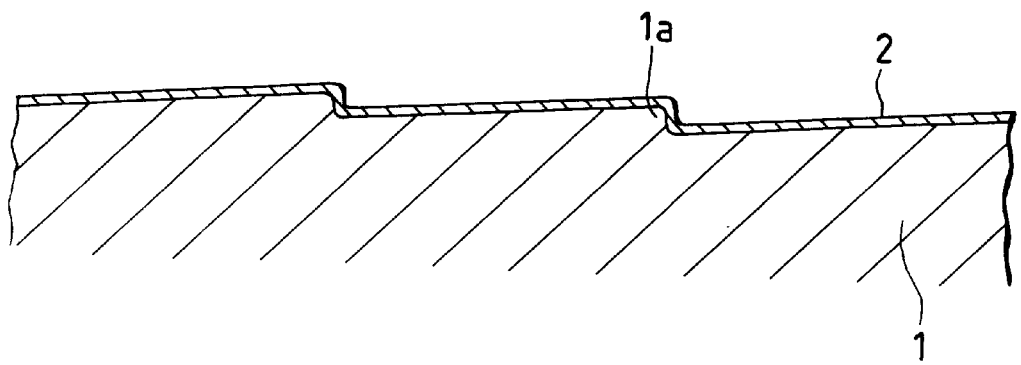
FIG. 1 is a cross sectional view showing an embodiment of a member for a fishing or sport tool according to the present invention.

FIG. 1 is a cross sectional view showing an embodiment of the member for a fishing or sport tool according to the present invention. Reference numeral 1 shown in the drawing represents the body of the member for a fishing or sport tool. Note that the shape and the size of the body 1 of the member are not limited particularly.

In a case where a fishing rod formed by winding a fiber reinforced prepreg is employed as the body 1 of the member, polishing of the surface of the fishing rod is carried out after the fiber reinforced prepreg has been wound, so that corner portions 1a formed by the ends of the fiber reinforced prepreg are formed as the residue portion, as shown in FIG. 1. The corner portions 1a cause the exterior to have the impression of the surface of the body under the film.

A metal film 2 having a substantially uniform thickness is formed on the body 1 of the member. As a result, the body 1 of the member can be covered. Moreover, the metal film 2 improves weather resistance of the body 1 of the member and causes the same to have property which prevents the main body from absorbing heat.

As a result of employment of the above-mentioned structure, a member for a fishing or sport tool having light weight and exhibiting excellent exterior can be obtained.

Figure 2:
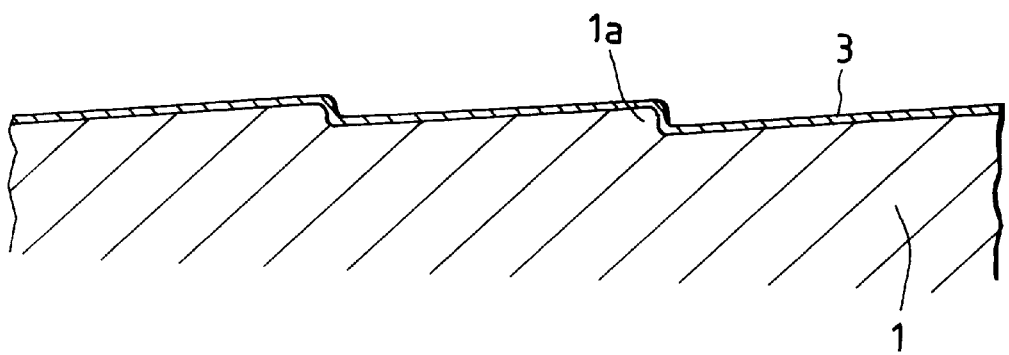
FIG. 2 is a cross sectional view showing another embodiment of the member for a fishing or sport tool according to the present invention.

FIG. 2 is a cross sectional view showing another embodiment of the member for a fishing or sport tool according to the present invention. In this embodiment, a single-color forming coating film 3 having a thickness calculated by dividing the odd number times of the ¼ optical thickness of the wavelength of a required color by the refraction factor, that is, a value satisfying the equation $(2m+1)\cdot\lambda/4=nd$ ($\lambda$=wavelength, n=refraction factor, d=thickness, and m is an integer), is formed on the body 1 of the member. It is preferable that the dispersion or non-uniformity of the thickness over the length of the single-color forming coating film 3 be set to be 5 nm to 50 nm in order to form a single color. Also in this case, corner portions 1a formed by ends of the fiber reinforced prepreg are created.

The fishing rod structured as described above and having the corner portions 1a is able to express the texture of the surface of the body under the film. Moreover, the single-color forming coating film 3 having the uniform thickness is able to express a required color (an interfered color having a substantially uniform hue). That is, a single color exterior having the texture of the surface of the body under the film can be expressed.

Although the structure in which the metal film 2 or the single-color forming coating film 3 is formed directly on the body 1 of the member has been described with reference to FIGS. 1 and 2, the present invention is not limited to the foregoing structures. For example, the metal film 2 or the single-color forming coating film 3 may be formed on the body 1 of the member through an intermediate layer, such as a film having a covering characteristic, a coating layer, an anode oxide film, a wet plating film, a dry coating film or a chemical conversion treatment film.

In addition, an anode oxide film may be formed on the metal film 2, or the metal film 2 itself may be subjected to anodizing to form the outer surface of the metal film 2 as an anode oxide surface, in order to provide an impressive and attractive color(s) therefrom. In case where the anode oxide film or the anode oxide surface is provided, it is possible to add rainbow-color to the member for a fishing or sport tool.

Although the structures shown in FIGS. 1 and 2 have the corner portions 1a provided for the body 1 of the member in order to express the influence of the ground, the metal film 2 or the single-color forming coating film 3 may be formed on a flat body of the member which does not have the corner portions 1a to exhibit a similar effect obtainable from the aforementioned embodiments.

Figure 3:
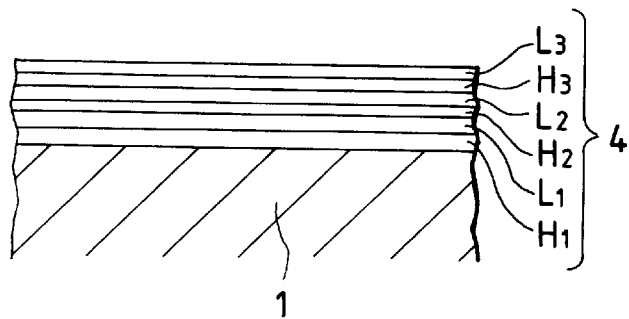
FIG. 3 is a cross sectional view showing another embodiment of the member for a fishing or sport tool according to the present invention.

FIG. 3 is a cross sectional view showing another embodiment of the member for a fishing or sport tool according to the present invention.

As the body 1 of the member shown in FIG. 3 may be the same as that according to each of the first and second embodiments shown in FIGS. 1 and 2.

A coating film 4 is formed on the body 1 of the member. The coating film 4 is formed by alternately laminating high refraction factor films $H_1$, $H_2$ and $H_3$ and low refraction factor films $L_1$, $L_2$ and $L_3$. The materials and the thicknesses of the films affect the hue of the color required to be expressed. The ratio of the refraction factor $n_b$ of the high refraction factor films and the refraction factor $n_a$ of the low refraction factor films affects the clearness (saturation) of the color, and the number of the films and $n_b/n_a$ affect the brightness of the color. Therefore, the thickness of each film of the laminate, the number of films and the materials of the films are selected properly to correspond to the color required to be expressed as the exterior.

The thickness of each of the high refraction factor films $H_1$, $H_2$ and $H_3$ and/or the low refraction factor films $L_1$, $L_2$ and $L_3$ is set such that the product of the thickness and the refraction factor of the film is the odd number times of the ¼ optical thickness of the wavelength of the color required to be expressed as the exterior. It is preferable that each film be set such that dispersion of the thickness over the length of the body of the member is 5 nm to 50 nm. As a result, the coating film 4 is able to form a single color. In particular, the more the ratio $n_b/n_a$ of the refraction factor of the high refraction factor films ($H_1$, $H_2$ and $H_3$, ..., $H_n$) and the low reflection factor films ($L_1$, $L_2$ and $L_3$. , ..., $L_n$) and the more the number of lamination times of the high refraction factor films and the low refraction factor films (the more the number of interfaces between the high refraction factor films and the low refraction factor films), the component of the color required to be expressed as the exterior is emphasized and clear color can be expressed by the following equation 1.

$$R=|(1-g^{2P})/(1+g^{2P})| \qquad \text{Equation 1}$$

where

R: transmittance g: refraction factor of high refraction factor film/refraction factor of low refraction factor film P: number of pairs of a high refraction factor film and a low refraction factor film As the material of the high refraction factor films $H_1$, $H_2$ and $H_3$, a dielectric substance, such as $TiO_2$, $ZrO_2$, $CeO_2$, $Bi_2O_3$, $In_2O_3$, $Fe_2O_3$ or ZnS may be employed. As the material of the low refraction factor films $L_1$, $L_2$ and $L_3$, a dielectric substance, such as $SiO_2$, SiO, $MgF_2$, $AlF_3$, $BaF_2$ or $CaF_2$ may be employed. The high refraction factor films $H_1$, $H_2$ and $H_3$ may be made of the same material or different materials. Also the low refraction factor films $L_1$, $L_2$ and $L_3$ may be made similarly to the above-mentioned method.

It is preferable that the number of the high refraction factor films $H_1$, $H_2$ and $H_3$ and the low refraction factor films $L_1$, $L_2$ and $L_3$ be 3 to 15 in consideration of the economic effect and the interference effect.

The very thin films, such as the high refraction factor films $H_1$, $H_2$ and $H_3$ and the low refraction factor films $L_1$, $L_2$ and $L_3$ each having a thickness of several angstrom, can accurately be formed by the above-mentioned PVD method or the CVD method.

It is preferable that the overall thickness of the coating film 4 be 40 nm to 500 nm in consideration of the adhesiveness and the wear resistance.

The above-mentioned structure is able to efficiently express the color required to be expressed as the exterior by the coating film 4 thereof. When, for example, a structure is employed in which a $TiO_2$ film having a thickness of 40 nm is used as each of the high refraction factor films $H_1$, $H_2$ and $H_3$ and a $SiO_2$ film having a thickness of 50 nm is used as the low refraction factor films $L_1$, $L_2$ and $L_3$, blue having a specific wavelength of about 430 nm can clearly be expressed on the exterior. If the dispersion of the thickness of the coating film 4 is about 20 nm, a single color can stably be formed.

The coating film 4 shown in FIG. 3 may be formed directly on the body 1 of the member or may be formed such that a film formed by alternately laminating films having different optical characteristics is previously manufactured and this film is bonded to the surface of the body 1 of the member. An intermediate layer, for example, a coating layer, an anode oxide film, a wet plating film, a dry coating film or a chemical conversion treatment film, may be formed on the body 1 of the member.

Although the structure has been described with reference to FIG. 3 in which the films having different refraction factors are laminated, the present invention may be applied to a structure in which films, such as metal films made of, for example, Ni, Cr and Al, having different optical characteristics are laminated.

Although the structure in which the coating film 4 is formed by laminating the plural films has been described with reference to FIG. 3, the structure according to this embodiment may be applied to a structure (a structure having no interface between films) in which regions having different optical characteristics overlap in a single coating film.

It is preferable that the embodiment shown in FIG. 3 be arranged such that the body 1 of the member is colored in, for example, black in order to efficiently absorb the components except for the component of the color required to be expressed as the exterior and to cause the specific color to clearly appear on the exterior. In a contrary case where color is required to be shaded off, it is preferable that the body 1 of the member be colored in a white type color (including a silver color) having a light reflectivity.

Figure 4:
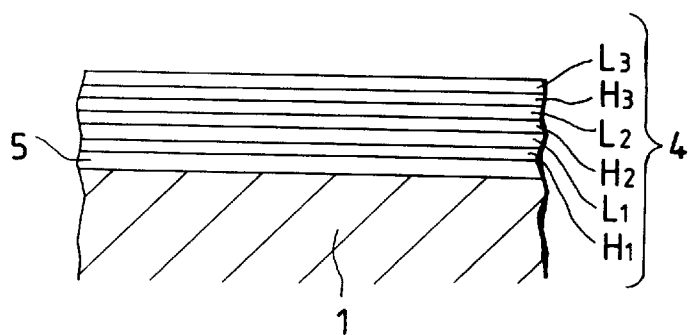
FIG. 4 is a cross sectional view showing another embodiment of the member for a fishing or sport tool according to the present invention.

FIG. 4 is a cross sectional view showing another embodiment of the member for a fishing or sport tool according to the present invention. A body 1 of the member shown in FIG. 4 may be the same according to the embodiment shown in FIGS. 1 and 2. A coating film 4 is formed similarly to that according to the embodiment shown in FIG. 3.

In this embodiment, a metal film 5 is formed between the body 1 of the member and the coating film 4. The metal film 5 affects the brightness of the color appearing as the exterior attributable to reflection in a visible region. Therefore, the material of the metal film 5 is properly selected to be adaptable to the color required to be expressed as the exterior. For example, a material (Al or Ag) having a high refraction factor in the visible region is selected as the material of the metal film 5 so that the exterior is made bright. When a material having a low refraction factor in the visible region is selected as the material of the metal film 5, a dark exterior is realized.

Also in this case, if dispersion of the thickness of the coating film 4 is about 20 nm, a single color can stably be formed.

Note that the coating film 4 shown in FIG. 4 may be directly formed on the body 1 of the member or may be formed such that a film formed by alternately laminating films having different optical characteristics is previously manufactured and this film is bonded to the surface of the body 1 of the member, similarly to the embodiment shown in FIG. 3 or may be formed on the body 1 of the member through a coating layer, an anode oxide film, a wet plating film, a dry coating film or a chemical conversion treatment film.

Figure 5:
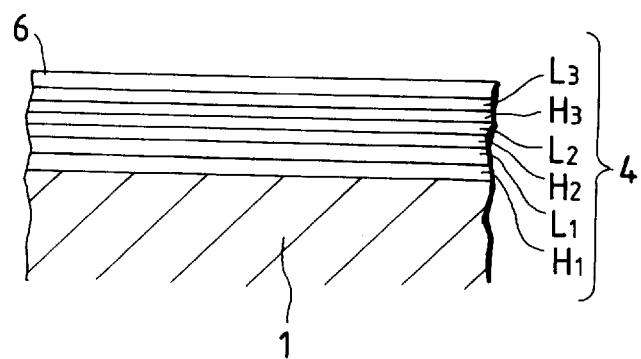
FIG. 5 is a cross sectional view showing another embodiment of the member for a fishing or sport tool according to the present invention.

FIG. 5 is a cross sectional view showing another cross sectional view showing another embodiment of the member for a fishing or sport tool according to the present invention. A body 1 of the member shown in FIG. 5 may be the same as that according to the embodiments shown in FIGS. 1 and 2. A coating film 4 is arranged similarly to that according to the embodiment shown in FIG. 3.

In this embodiment, a protective layer 6 is formed on the coating film 4. The protective layer 6 is a transparent or semitransparent film which does not deteriorate a required color formed with the coating film 4 and which protects the coating film 4. That is, the thickness of the protective layer 6 is determined in accordance with the following equation 2 so that the light refraction factor is minimized. Thus, it is able to maintain the required color formed by the coating film 4 and protect the coating film 4.

$$R_{min}=[(n_f^2-n_0 \cdot n_s)/(n_f^2+n_0 \cdot n_s)]^2 \qquad \text{Equation 2}$$

where $n_f \cdot d_f = \lambda/4$ $n_f = \sqrt{(n_0 \cdot n_s)}$ $R_{min}$: minimum refraction factor $n_s$: refraction factor of low refraction factor film $L_3$ $n_f$: refraction factor of protective film $\lambda$: wavelength of light $n_0$: refraction factor of air $d_f$: thickness of protective layer When the protective layer 6 is formed into a multi-layered structure, the refraction factor can be minimized in wavelength region in a wide range. Thus, the desired color realized with the coating film 4 can be maintained and protected.

Also in this case, if dispersion of the thickness of the coating film 4 is about 20 nm, a single color can stably be formed.

Similarly to the embodiment shown in FIG. 3, the coating film 4 shown in FIG. 5 may be formed directly on the body 1 of the member or may be formed such that a film formed by alternately laminating films having different optical characteristics is previously manufactured and this film is bonded to the surface of the body 1 of the member or may be formed on the body 1 of the member through a coating layer, an anode oxide film, a wet plating film, a dry coating film or a chemical conversion treatment film.

It is preferable that the above-mentioned embodiments be structured such that the surface of the body 1 of the member be, as described above, formed into a smooth and flat shape in order to express a required color. The term "smooth and flat" means a fact that the surface of the body 1 of the member is smooth regard less of whether or not the body 1 of the member has the corner portions 1a. Since the single-color forming coating film, the high refraction factor films and the low refraction factor films are very thin films, they follow the shape of the ground. Therefore, in order to obtain an exterior with which a single color is formed regardless of the direction, it is preferable that the ground for the thin films be made smooth and flat. Also a case where matting coating using a #600- polisher is performed to form fine wavy portions about 1 μm to about 10 μm over the member is included in the foregoing category "smooth and flat". In this case, a light and soft single color is formed.

It is preferable that the foregoing embodiments be structured such that the body 1 of the member is colored in, for example, black having a light shielding characteristic, in order to form a specific color.

Although each of the foregoing embodiments has been described about the case where the body of the member for a fishing or sport tool is a fishing rod formed by winding a fiber reinforced prepreg, the present invention is not limited to this. The present invention may similarly be applied to a case where the body of the member is another member for a fishing or sport tool.

As described above, the member for a fishing or sport tool according to the present invention comprises a body of the member; a film formed directly on the body of the member or through an intermediate layer; and a single-color forming coating film formed on the outside of the film and capable of transmitting or reflecting only components in a wavelength region included in a specific range among incident light beams. Therefore, light weight and excellent exterior can be realized.

Figure 6:
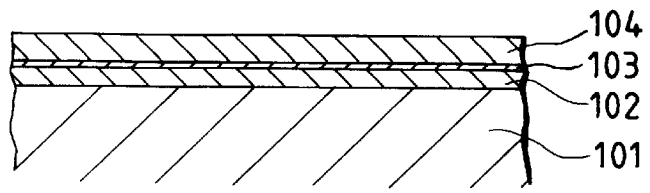
FIG. 6 is a cross sectional view showing another embodiment of a member having a decoration layer according to the present invention.

FIG. 6 is a cross sectional view showing another embodiment of a member having a decoration layer. Referring to the drawing, reference numeral 101 represents a body of the member. A ground layer 102 is formed on the body 101 of the member. A metal layer 103 having such a small thickness as to express the color of the ground layer as the exterior is formed on the ground layer 102. Moreover, a transparent or semitransparent protective layer 104 is formed on the metal layer 103.

As the material of the body 101 of the member, synthetic resin, such as polyamide resin, glass fiber reinforced polyamide resin, ABS (acrylonitrile-butadiene-styrene) resin, glass fiber reinforced ABS resin or polycarbonate resin; fiber reinforced prepreg prepared by impregnating synthetic resin, such as epoxy resin, phenol resin or polyester into reinforced fiber, such as carbon fiber, glass fiber, alumina fiber or aramide fiber; metal, such as aluminum alloy, magnesium alloy or titanium alloy; or ceramics such as zirconium oxide, aluminum oxide, silicon carbide or silicon nitride.

As the ground layer 102, a decoration layer, such as a coating layer or a printed layer, or a double-molded layer may be employed. In order to cause the directions of light reflection from the metal layer 103 on the ground layer 102 to be concentrated into a specific direction, the surface of the ground layer 102 may be formed into a wavy shape. Since the ground layer 102 is required if necessary, the surface of the body 101 of the member may be formed into a wavy shape in a case where the ground layer 102 is not provided.

As the material of the metal layer 103, Al, Cu, Ag, Mg, In, Cr, Si, Ni, Ti, Au, Rh, Pt or the like may be employed.

In this embodiment, the thickness of the metal layer 103 is set to be a small value with which the color of the body of the member or the ground layer can be expressed as the exterior. That is, the thickness of the metal layer 103 is set to be a value with which the metal layer 103 is made to be transparent or semitransparent to cause the color of the body 101 of the member or the ground layer 102 (the ground layer 102 in the case shown in FIG. 6) is expressed as the exterior. Specifically, it is preferable that the thickness of the metal layer 103 be 1 nm to 1 μm.

As the material of the protective layer 104, a fluororesin coating medium or an epoxy resin coating medium may be employed. It is preferable that the thickness of the protective layer 104 be 5 μm to 100 μm in consideration of the adhesiveness, water resistance and wear resistance.

Since the member having a decoration layer structured as described above is formed such that the metal layer 103 is thinned to an extent with which the color of the ground layer or the body of the member can be expressed as the exterior, the color of the ground layer or the body of the member can sufficiently be recognized visually. Moreover, the effect of reflection of light from the metal layer 103 is added to the color of the ground layer or the body of the member. Therefore, excellent exterior can be realized because luster is added to the color of the ground layer or the body of the member.

Figure 7:
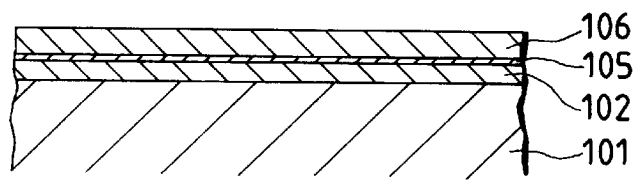
FIG. 7 is a cross sectional view showing another embodiment of the member having a decoration layer according to the present invention.

FIG. 7 is a cross sectional view showing another embodiment of the member having a decoration layer according to the present invention. Referring to the drawing, reference numeral 101 represents a body of the member. A ground layer 102 is formed on the body 101 of the member. A metal layer 105 is formed on the ground layer 102. Moreover, a protective layer 106 is formed on the metal layer 105 such that the color of the metal layer 105 is not expressed as the exterior but reflection from the metal layer 105 is expressed as the exterior.

As the material of the metal layer 105, the same material for forming the metal layer 103 may be employed. It is preferable that the thickness of the metal layer 105 be 5 nm to 3 μm in consideration of a leveling effect. When the thickness of the metal layer 105 is set to satisfy a value obtained by dividing odd number times of the ¼ optical thickness of the wavelength of a required color as the exterior by a refraction factor, that is, a value satisfying $(2m+1) \cdot \lambda/4 = nd$ ($\lambda$: wavelength, n: refraction factor, d: thickness and m: an integer), a single color can be expressed. As a result, an interference effect is intensified and thus the color is made to be brighter. As for the thickness of the metal layer 105, when, for example, blue having a wavelength of 430 nm to 490 nm is formed, it is preferable that nd be odd number times of 107.5 nm to 122.5 nm which is $\lambda/4$. When green having a wavelength 490 nm to 550 nm is formed, it is preferable that nd be odd number times of 122.5 nm to 137.5 nm which is $\lambda/4$. When yellow (golden color) having a wavelength of 550 nm to 590 nm is formed, it is preferable that nd be odd number times of 137.5 nm to 147.5 nm which is $\lambda/4$. When red having a wavelength of about 640 nm to about 780 nm is formed, it is preferable that nd be odd number times of 160 nm to 195 nm which is $\lambda/4$. Since the metal layer 105 is simply required to reflect light, any color may be provided and also the structure may be formed into a single layer or a multi-layered structure. In this case, the structure may be employed in which a metal layer which does not express a single color and a metal layer which expresses a single color are combined with each other.

The protective layer 106 is formed on the metal layer 105 in such a manner that the color of the metal layer 105 is not expressed as the exterior and reflection from the metal layer 105 is expressed as the exterior. That is, the protective layer 106 is in a colored or a semitransparent state so that the metal layer 105 is covered but the color of the metal layer 105 and light reflected from the same are partially expressed. Therefore, a fluororesin coating medium, an epoxy resin coating medium or the like may be employed as the material for the protective layer 106. It is preferable that the thickness of the protective layer 106 be 5 μm to 100 μm in order to cause the foregoing characteristics to be exhibited.

Since the member having a decoration layer structured as described above is arranged such that light reflected by the metal layer 105 is partially used to express it as the exterior, coloring of the protective layer 106 can be made brighter and advantageous. Thus, impressive exterior can be expressed.

Figure 8:
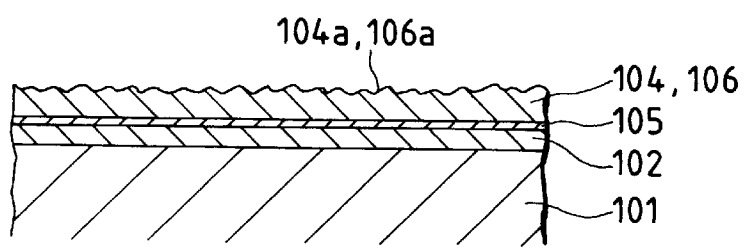
FIG. 8 is a cross sectional view showing another embodiment of the member having a decoration layer according to the present invention.

When the foregoing two embodiments are structured such that the surfaces of the protective layers 104 and 106 are, as shown in FIG. 8, formed into roughened surfaces 104a and 106a, reflected light can irregularly be reflected so that a particular exterior is expressed. In this case, when the roughened surfaces 104a and 106a are provided for the grip portion, a slippage prevention effect can be obtained.

Figure 9:
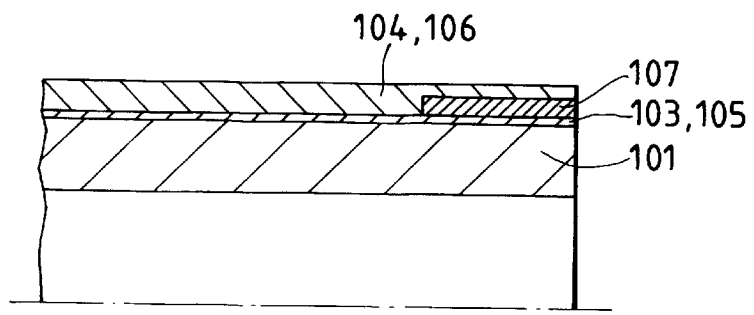
FIG. 9 is a cross sectional view showing another embodiment of the member having a decoration layer according to the present invention.

When the foregoing two embodiments are structured as shown in FIG. 9 such that a pattern layer 107 formed in a metal color is partially provided on the metal layers 103 and 105, an impression as if a metal element, such as an end ring or the like, is attached can be obtained. Since no metal element is attached in actual, no step portion is created and enlargement of the weight can be prevented. The surface of each of the protective layers 104 and 106 on the pattern layer 107 may be warped into a concave or convex shape to exhibit the lens effect. As a result, excellent exterior can be realized.

Figure 10:
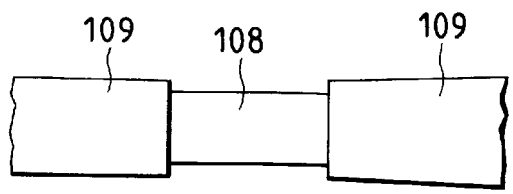
FIG. 10 is a cross sectional view showing another embodiment of the member having a decoration layer according to the present invention.

When a member 108 having a decoration layer is, as shown in FIG. 10, attached between elements 109 having considerably projecting portions, the member 108 can be protected from external force. When the pattern layer 107 is provided as described above, metallic exterior can be expressed even in a portion to which a metal element cannot be attached. Note that a portion of each of the metal layers 103 and 105 is removed or marked to form, for example, hair lines or a geometric pattern in place of providing the pattern layer 107.

Figure 11:
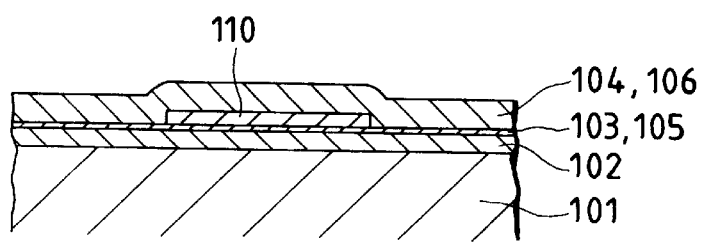
FIG. 11 is a cross sectional view showing another embodiment of the member having a decoration layer according to the present invention.

As shown in FIG. 11, a seal 110 having a pattern formed on the surface thereof and made of polyester or polyvinyl chloride may be, in place of the pattern layer 107, bonded to the metal layers 103 and 105. When the seal 110 is used, fine and small characters and shapes can clearly be expressed by screen printing. When the seal 110 is used, the adhesiveness with the protective layers 104 and 106 can be improved and the manufacturing cost can be reduced.

As the method for forming the metal layers 103 and 105 according to the foregoing embodiments, a PVD (Physical-Vapor Deposition) method including a vacuum evaporation method, a sputtering method, an ion plating method; a CVD (Chemical Vapor Deposition) method including a P-CVD (Plasma CVD), MOCVD (Metal Organic CVD); and a wet plating method may be employed. The method of forming the ground layer 102 and the protective layers 104 and 106 is exemplified by usual die coating, gun spray coating and brushing (brush coating).

The member having a decoration layer according to the present invention may be used in a fishing tool including a fishing rod, a reel, a lure, a tackle box, a consort ship and small articles, a shaft and a head of a golf club, a tennis racket, a badminton racket, a frame of a bicycle and the like.

As described above, the member having a decoration layer according to the present invention comprises: a body of the member; a thin metal layer formed directly on the body of the member or through a ground layer and having a small thickness permitting the color of the body of the member or the ground layer to be expressed as the exterior; and a transparent or semitransparent protective layer formed on the metal layer. Therefore, the exterior (the pattern) of the body of the member or the ground layer can be exhibited. Moreover, exterior having luster realized attributable to reflection of light from the metal layer can be obtained. Thus, an excellent design quality can be obtained. Since the metal layer is formed very thinly, it attributes to reducing the weight of a sport tool employing this.

Moreover, the member having a decoration layer, comprises a body of the member; a metal layer formed directly on the body of the member or through a ground layer; and a protective layer formed on the metal layer arranged to inhibit the color of the metal layer to appear as the exterior and permit reflection by the metal layer to be expressed as the exterior. Therefore, excellent exterior can be realized because luster realized attributable to reflection of light from the metal layer is added to the exterior of the protective layer. Even if the surface of the protective layer is rubbed or damaged, the existence of the protective layer maintains the luster texture and thus excellent exterior can be maintained.

Figure 12:
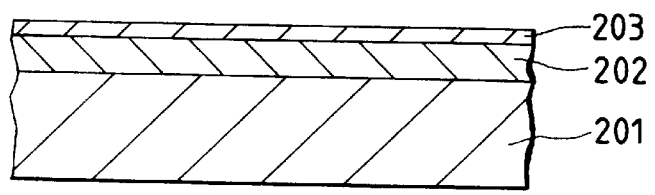
FIG. 12 is a cross sectional view showing another embodiment of a member for a fishing or sport tool according to the present invention.

As shown in FIG. 12, a member for a fishing or sport tool, which constitutes another embodiment of the present invention comprises: a body 201 of the member; a synthetic resin coating film 202 formed on the body of the member 201; and a thin decorating film 203 formed on the synthetic resin coating film 202, wherein the synthetic resin coating film 202 has characteristics approximating characteristics of the thin decorating film 203.

Figure 13:
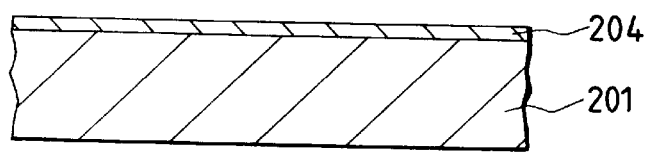
FIG. 13 is a cross sectional view showing another embodiment of a member for a fishing or sport tool according to the present invention.

As shown in FIG. 13, a member for a fishing or sport tool, which constitutes another embodiment of the present invention, comprises: a body 201 of the member; and a very thin hard coating film 204.

Figure 14:
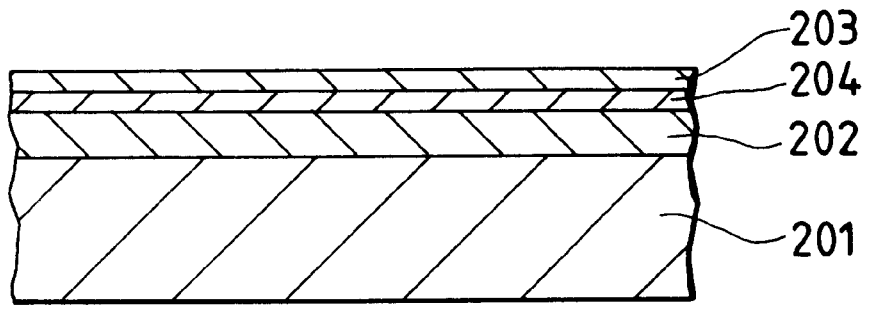
FIG. 14 is a cross sectional view showing another embodiment of a member for a fishing or sport tool according to the present invention.

As shown in FIG. 14, a member for a fishing or sport tool, which constitutes another embodiment of the present invention, comprises: a body 201 of the member; a synthetic resin coating film 202 formed on the body 201 of the member; a hard coating film 204 formed on the synthetic resin coating film 202; and a thin decorating film 203 formed on the hard coating film 204.

In the embodiments shown in FIGS. 12 to 14, the body 201 of the member may be made of synthetic resin, such as polyamide resin, glass fiber reinforced polyamide resin, ABS (acrylonitrile-butadiene-styrene) resin, glass fiber reinforced ABS resin or polycarbonate resin; fiber reinforced prepreg prepared by impregnating synthetic resin, such as epoxy resin, phenol resin or polyester into reinforced fiber, such as carbon fiber, glass fiber, alumina fiber or aramide fiber; metal, such as aluminum alloy, magnesium alloy or titanium alloy; or ceramics such as zirconium oxide, aluminum oxide, silicon carbide or silicon nitride.

In the embodiments shown in FIGS. 12 and 14, the synthetic resin coating film 202 formed on the body 201 of the member may be a coating layer, a printed layer, a primer layer, a pattern layer or the like. The synthetic resin coating film 202 may be formed by a printing method, a gun spray coating method, a die coating method, a dipping coating method or the like.

In the embodiments shown in FIGS. 12 and 14, the thin decoration film 203 formed directly on the synthetic resin coating film 202 or thorough the hard coating film 204 means a metal film or a ceramic film using reflectance of metal or ceramics to adjust the brightness and the saturation of color appearing as the exterior and to cover the body of the member and the ground layer. Metal forming the metal film is exemplified by Al, Cu, Ag, Mg, In, Cr, Si, Ni, Au, Rh, Pt and the like. As the ceramics forming the ceramic film is exemplified by TiN, TiC, CrCN, TiAlN, DLC (diamond-like carbon), $Al_2O_3$, SiC, $Si_3N_4$, ZrC and the like. By using, Cr, stainless steel, Ni or the like as the material for forming the metal film, the color appearing as the exterior can be made to be brighter than the color obtained from only the coating layer. Moreover, the corrosion resistance can be improved.

The thin decoration film 203 may be formed of a plurality of films made of the above-mentioned materials. By combining the plural films, a variety of hues can easily be expressed. When, for example, blue type color is expressed on the exterior, it is preferable that metal films in a sequential order as a Ni film and a Ti film be formed on the body 201 of the member through the synthetic resin coating film 202. When yellow type color is expressed on the exterior, it is preferable that metal films in a sequential order as a Cr film and a Ti film be formed on the body 201 of the member through the synthetic resin coating film 202. As a result, bright blue or yellow can be expressed.

It is preferable that the thickness of the thin decoration film be 20 nm to 10 $\mu$m in consideration of the hue, durability, time required to complete the process, weight and cost, more preferably 50 nm to 200 nm.

A method of forming the thin decoration film 203 is exemplified by a PVD (Physical-Vapor Deposition) method including a vacuum evaporation method, a sputtering method, an ion plating method; a CVD (Chemical Vapor Deposition) method including a P-CVD (Plasma CVD), MOCVD (Metal Organic CVD); and a wet plating method.

In the embodiment shown in FIG. 12, the synthetic resin coating film 202 has characteristics approximating the characteristic of the thin decoration film 203. In this case, the following methods are applicable: a method in which the hardness of the synthetic resin coating film 202 is allowed to approximate the hardness of the thin decoration film 203, a method in which the thermal expansion coefficient of the synthetic resin coating film 202 is allowed to approximate the thermal expansion coefficient of the thin decoration film 203 and a method in which the thickness of the synthetic resin coating film 202 is reduced.

As the method for allowing the hardness of the synthetic resin coating film 202 to approximate the hardness of the thin decoration film 203, for example, a method may be employed in which a material having hardness approximating the hardness of the thin decoration film 203, for example, 4H, is employed to form the synthetic resin coating film 202. In this case, the material of the synthetic resin coating film 202 may be a organopolysiloxane material, polyester acrylate type ultraviolet curing resin, urethaneacrylate type ultraviolet curing resin or an acrylsilicon resin material using both silicon crosslinking and epoxy-amino crosslinking. Also metal, such as Al, Ni or brass, acrylic coating medium containing an inorganic substance, such as $SiO_2$, $TiO_2$ or $Al_2O_3$, urethane coating medium or epoxy coating medium may be employed. By using the foregoing material, the hardness of the synthetic resin coating film 202 is set to be 3H or greater, preferably 4H to 6H.

In this case, it is preferable that the thickness of the synthetic resin coating film 202 be 1 $\mu$m to 10 $\mu$m in consideration of the exterior, weight, working efficiency, durability and the amount of deformation.

As a result, the difference between the hardness of the synthetic resin coating film 202 and the hardness of the thin decoration film 203 can be reduced so that separation and destruction of the thin decoration film 203 are prevented.

The method of allowing the thermal expansion coefficient of the synthetic resin coating film 202 to approximate the thermal expansion coefficient of the thin decoration film 203 is exemplified by a method in which the material for forming the thin decoration film 203 is mixed with the material for forming the synthetic resin coating film 202 and a method in which the difference in the thermal expansion coefficient between the thin decoration film 203 and the synthetic resin coating film 202 is reduced by forming, between the thin decoration film 203 and the synthetic resin coating film 202, a coating film made of a material having a thermal expansion coefficient, the positive sign or the negative sign of which is different from that of the thermal expansion coefficient of the thin decoration film 203 or the synthetic resin coating film 202. By employing the above-mentioned method, the thermal expansion coefficient of the synthetic resin coating film 202 is allowed to approximate the thermal expansion coefficient of the thin decoration film 203.

As a result, the difference between the thermal expansion coefficient of the synthetic resin coating film 202 and the thermal expansion coefficient of the thin decoration film 203 can be reduced so that separation and destruction of the thin decoration film 203 are prevented.

In this case, the material of the synthetic resin coating film 202 is exemplified by acrylic resin, urethane resin, epoxy resin and organopolysiloxane resin.

In the case where the thickness of the synthetic resin coating film 202 is reduced, the thickness is made to be 10 $\mu$m or smaller, preferably 5 $\mu$m or smaller and more preferably 3 $\mu$m. As a result, deformation and expansion/contraction of the synthetic resin coating film 202 can be prevented so that separation and destruction of the thin decoration film 203 are prevented.

When the thin synthetic resin coating film 202 is formed as described above, the amount of diluent for the coating medium is enlarged to set the content of the resin to be about 25% or lower. As a result, the viscosity of the coating medium is lowered and thus the thin synthetic resin coating film 202 can be formed. The thin synthetic resin coating film 202 enables the finish of the exterior to be performed satisfactorily and also reduces the weight.

The material of the synthetic resin coating film 202 in the foregoing case is exemplified by acrylic resin, urethane resin, epoxy resin and organopolysiloxane.

In the embodiment shown in FIG. 13, the thickness of the hard coating film 204 in the case where the hard coating film 204 having a very small thickness is formed on the body 201 of the member is set to be 10 μm or smaller, preferably 2 μm to 6 μm in consideration of the weight, durability and the exterior.

The material of the hard coating film 204 is required to have hardness of 4H or greater, preferably 5H or greater. Specifically, the material is exemplified by metal, such as Ni, Cr or Ti, ceramics, such as TiC, TiN, SiC, $Al_2O_3$, CrCN, TiAlN, $Si_3N_4$, ZrC or DLC (diamond-like carbon) and hard resin.

The hard resin is exemplified by a so-called hard coat material, such as melamine resin, urethane resin, alkyd resin, acrylic resin, polyfunctional acrylic resin, phenol resin, polyphenylsulfide resin, silicon resin or a partial hydrolysate of silane. As the hard coat material, an inorganic coat material (inorganic/organic hybrid hard coat material) obtainable by a sol-gel technology may be employed.

When the very thin hard coating film is formed in the case where the hard coat material is employed, component resin having a small molecular weight is employed to lower the viscosity or a diluent is employed in a large quantity with the component resin to lower the viscosity. When the hardness of the hard coating film is adjusted in the case where the hard coat material is employed, a method may be employed which is exemplified by a method in which the degree of crosslinking of the component resin is varied by changing the conditions under which the hard coat material is cured, a method in which additives are added to the hard coat material and a method in which the component resin of the hard coat material is changed.

When the very thin hard coating film 204 is formed on the body 201 of the member as described above, the body 201 of the member can be protected. In a case where the body of the member is formed into a pipe shape for use as a fishing rod, the member can be protected if it touches a rock or sand. If a structure in which another rod is inserted into a rod is employed, the rods are protected when they are rubbed each other. Moreover, the rods can be protected from being rubbed at the joint of the rods. As a result, the durability of the body of the member can be improved.

Since the hard coating film 204 has a very small thickness, the weight of the member can be reduced. Since the size of the member is not affected, that is, since the size of the member is not affected even if the thickness of the hard coating film is dispersed, the degree of completion (the stability of the size of the product) can be improved. By thinning the hard coating film 204, generation of cracks in the hard coating film attributable to deformation of the member can be prevented.

In the embodiment shown in FIG. 14, the hard coating film 204 is formed between the synthetic resin coating film 202 and the thin decoration film 203. In this case, it is preferable that a material for the hard coating film 204 be selected from the foregoing materials that has hardness similar to the hardness of the synthetic resin coating film 202 and the hardness of the thin decoration film 203.

The method of forming the hard coating film 204 is exemplified by a sputtering method, a CVD method, a coating method, a spraying method and a roll coating method.

Figure 15:
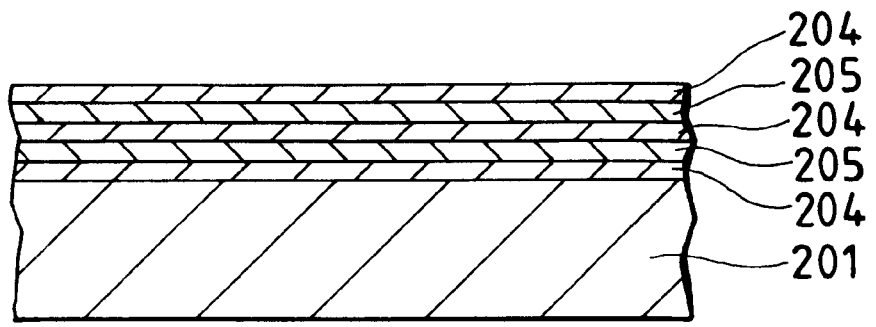
FIG. 15 is a cross sectional view showing another embodiment of a member for a fishing or sport tool according to the present invention.

The hard coating film 204 be formed into a single layer structure or a multi-layered structure. By forming the hard coating film 204 into the multi-layered structure, dispersion of the thickness of the hard coating film can be prevented and defects attributable to the coating operation, such as running and cissing occurring when the coating film is formed, can be prevented. In the case where the hard coating film 204 is formed into the multi-layered structure, a buffer layer 205 as shown in FIG. 15 may be formed between the hard coating film 204 and the hard coating film 204. When the buffer layer 205 is formed, generation of cracks in the hard coating film can furthermore efficiently be prevented. The material for forming the buffer layer 205 is required to be softer than the material for forming the metal film. It is preferable that the thickness of the buffer layer 5 be 10 μm or smaller.

In the emodiments shown in FIGS. 12 to 14, a transparent or semitransparent protective layer made, for instance, of SiO, $SiO_2$, $MgF_2$, $AlF_3$, $BaF_2$, $CaF_2$, $ZrO_2$, $Cr_2O_3$, an organic silicon compound, such as polysiloxane or polydimethylsiloxane, or fluororesin such as polytetrafluoroethylene or perfluoroalkylacrylate, that is, a layer realizing wear resistance, water repellency, abrasion resistance and the like may be formed on the thin decoration film 203. In this case, it is preferable that the thickness of the protective layer be 20 nm to 10 μm in consideration of weight, durability and the exterior. Note that the protective layer can be formed by the foregoing PVD method, the CVD method or the coating method.

The embodiments shown in FIGS. 12 and 14 relate to the structure between the synthetic resin coating film 202 and the thin decoration film 203. The structure may be applied to all of portions in which the interface between the synthetic resin coating film 202 and the thin decoration film 203 exists. For example, the present invention may be applied to a case where the thin decoration film 203 is formed on the inside of the synthetic resin coating film 202 and to a case where the synthetic resin coating film 202 and the thin decoration film 203 are formed adjacently on the same plane.

Examples will now be described which have been performed to clarify the present invention.

(EXAMPLE 1)

Fiber reinforced prepreg prepared by impregnating epoxy resin in carbon fiber oriented into a specific direction was wound around a mandrel, and then heated so that the epoxy resin was hardened. Then, the mandrel was removed so that a pipe shape member which was the body of the member was manufactured.

Then, the surface of the pipe shape member was subjected to a polishing process by using a #400 polisher, and then the pipe shape member was washed with a solvent.

Then, the surface of the washed pipe shape member was coated with polyester acrylate by a gun spray method, and then drying was performed. Thus, a synthetic resin coating film having a thickness of 5 μm was formed. Note that the hardness of the formed synthetic resin coating film was examined by a method conforming to JIS K 5400. The hardness was 6H.

The surface of the pipe shape member was coated with Cr by ion plating to have a thickness of 80 nm so that the thin decoration film was formed. Note that the hardness of the thin decoration film was examined by a method conforming to JIS K 5400. The hardness was 6H. Thus, the hardness of the synthetic resin coating film and the hardness of the thin decoration film were allowed to approximate each other.

Then, polyurethane resin coating medium was applied to the thin decoration film, and then dried. Thus, a protective layer having a thickness of 8 μm was formed. Thus, a pipe shape member for a fishing rod, which was the member for a fishing or sport tool according to the present invention, was manufactured.

The pipe shape member for a fishing rod was subjected to an accelerated durability test (a salt spray test and a heat and cold weather material test) to examine separation and destruction of the thin decoration film. As a result, no separation and destruction took place. Moreover, the pipe shape member for a fishing rod has light weight and excellent exterior.

(EXAMPLE 2)

Fiber reinforced prepreg prepared by impregnating epoxy resin in carbon fiber oriented into a specific direction was wound around a mandrel, and then heated so that the epoxy resin was hardened. Then, the mandrel was removed so that a pipe shape member which was the body of the member was manufactured.

Then, the surface of the pipe shape member was subjected to a polishing process by using a #400 polisher, and then the pipe shape member was washed with a solvent.

Then, the surface of the washed pipe shape member was coated with a material for forming a coating layer, such as an epoxy coating medium or a urethane coating medium by a gun spray method, and then drying was performed. Thus, a synthetic resin coating film having a thickness of 5 μm was formed. Al particles were mixed with the material for forming the coating layer so that the thermal expansion coefficient was adjusted.

The surface of the pipe shape member was coated with Cr by ion plating to have a thickness of 80 nm so that the thin decoration film was formed and the thermal expansion coefficients were allowed to approximate each other.

Then, a polyurethane resin coating medium was applied to the thin decoration film, and then drying was performed so that a protective layer having a thickness of 8 μm was formed. Thus, a pipe shape member for a fishing rod, which was the member for a fishing or sport tool according to the present invention, was manufactured.

The pipe shape member for a fishing rod was subjected to an accelerated durability test to examine separation and destruction of the thin decoration film. As a result, no separation and destruction took place. Moreover, the pipe shape member for a fishing rod has light weight and excellent exterior.

(EXAMPLE 3)

Fiber reinforced prepreg prepared by impregnating epoxy resin in carbon fiber oriented into a specific direction was wound around a mandrel, and then heated so that the epoxy resin was hardened. Then, the mandrel was removed so that a pipe shape member which was the body of the member was manufactured.

Then, the surface of the pipe shape member was subjected to a polishing process by using a #400 polisher, and then the pipe shape member was washed with a solvent.

Then, the surface of the washed pipe shape member was coated with the foregoing material for forming a coating layer by a gun spray method, and then drying was performed. Thus, a thin synthetic resin coating film having a thickness of 3 μm was formed. Note that a material containing resin by 20% was employed as the material for forming the coating layer to easily form a thin film.

The surface of the pipe shape member was coated with Cr by ion plating to have a thickness of 80 nm so that the thin decoration film was formed. Thus, a pipe shape member for a fishing rod, which was the member for a fishing or sport tool according to the present invention, was manufactured.

The pipe shape member for a fishing rod was subjected to an accelerated durability test to examine separation and destruction of the thin decoration film. As a result, no separation and destruction took place. The reason for this can be considered that deformation and expansion/contraction of the synthetic resin coating film having a small thickness were restrained and it did not considerably affect the thin decoration film.

(EXAMPLE 4)

Fiber reinforced prepreg prepared by impregnating epoxy resin in carbon fiber oriented into a specific direction was wound around a mandrel, and then heated so that the epoxy resin was hardened. Then, the mandrel was removed so that a pipe shape member which was the body of the member was manufactured.

Then, the surface of the pipe shape member was subjected to a polishing process by using a #400 polisher, and then the pipe shape member was washed with a solvent.

Then, the surface of the washed pipe shape member was coated with polyester acrylate as a hard coat material by spraying, and then UV irradiation was performed. Thus, a thin hard coating film having a thickness of 3 μm was formed. The hardness of the hard coating film was 5H.

Then, a polyurethane resin coating medium was applied to the surface of the hard coating film, and then drying was performed. Thus, a protective layer having a thickness of 8 μm was formed. As a result, a pipe shape member for a fishing rod, which was the member for a fishing or sport tool according to the present invention, was manufactured.

The pipe shape member for a fishing rod was subjected to an accelerated durability test to examine separation and destruction of the thin decoration film. As a result, no separation and destruction took place. Moreover, the pipe shape member for a fishing rod has light weight and excellent exterior.

(Comparative Example)

Fiber reinforced prepreg prepared by impregnating epoxy resin in carbon fiber oriented into a specific direction was wound around a mandrel, and then heated so that the epoxy resin was hardened. Then, the mandrel was removed so that a pipe shape member which was the body of the member was manufactured.

Then, the surface of the pipe shape member was subjected to a polishing process by using a #400 polisher, and then the pipe shape member was washed with a solvent.

Then, the surface of the washed pipe shape member was coated with a material for forming a coating layer by a gun spray method, and then drying was performed. Thus, a synthetic resin coating film having a thickness of 15 μm was formed. The hardness of the synthetic resin coating film was examined by a method conforming to JIS K 5400. As a result, the hardness was H. The surface of the pipe shape member was coated with Cr by ion plating to have a thickness of 80 nm so that the thin decoration film was formed.

Then, a polyurethane resin coating medium was applied to the surface of the thin decoration film, and then drying was performed. Thus, a protective layer having a thickness of 8 μm was formed. As a result, a pipe shape member for a fishing rod, which was the member for a fishing or sport tool according to the present invention, was manufactured.

The pipe shape member for a fishing rod was subjected to an accelerated durability test to examine separation and destruction of the thin decoration film. As a result, separation and destruction took place and thus the exterior deteriorated.

Although the foregoing examples have been described about the structure in which the body of the member for a fishing or sport tool is the pipe shape member manufactured by winding the fiber reinforced prepreg, the present invention is not limited to this. The present invention may be applied to a structure in which the body of the member is another member for a fishing or sport tool.

As described above, the member for a fishing or sport tool according to the present invention comprises a body of the member; a synthetic resin coating film formed on the body of the member; and a thin decorating film formed on the synthetic resin coating film, wherein the synthetic resin coating film has characteristics approximating characteristics of the thin decorating film, or comprises a body of the member; a synthetic resin coating film formed on the body of the member; a hard coating film formed on the synthetic resin coating film; and a thin decorating film formed on the hard coating film. Therefore, the decoration layer free form separation and destruction is formed so that light weight and excellent exterior are realized.

The present invention will be described further in detail with reference to embodiments shown in FIG. 16 to 20.

FIGS. 16 to 20 are enlarged views of a surface portion of a reel, which are enlarged cross sectional views each showing examples of the surface portion of an article having a interference coating film according to the present invention. The surface of an article body 310 made of synthetic resin, fiber reinforced synthetic resin or ceramics is formed into a rough shape (a state of finish corresponding to about two or three triangle finish symbols). An opaque (or non-transparent) metal film 312 is formed on the rough surface S4, and then a transparent layer 314 having an average thickness of about several microns is applied to cover and smoothen a small wavy surface S3. Then, a thin transparent coating film 316 having a uniform thickness of about thousands angstrom is formed on the surface S2. The rough surface can be obtained such that the surface of a mold is formed into a grained or wrinkled surface when the rough surface is molded with a mold or such that the molded article body is subjected to a shot blast process or a barrel process.

The metal film 312 is an opaque and light reflecting film made of aluminum, chrome, nickel, gold, zinc or the like. The transparent layer 314 is formed by using a transparent coating medium, such as a UV coating medium (a ultraviolet coating medium), so that a flat and smooth surface S2 is formed. The UV coating medium has a surface leveling effect superior to a thermodrying coating medium. The thin transparent coating film 316 is formed similarly to a coherent coating film for optical glass made of an oxide exemplified by aluminum oxide ($Al_2O_3$), titanium oxide ($TiO_2$), silicon monoxide (SiO), silicon dioxide ($SiO_2$), magnesium oxide (MgO), chrome oxide ($Cr_2O_3$) and the like, and a substance having a covalent bond is exemplified by zinc sulphide (ZnS), lithium fluoride (LiF), magnesium fluoride ($MgF_2$), calcium fluoride ($CaF_2$), sodium fluoride (NaF) and the like.

With the above-mentioned structure, light with which the reel is irradiated is reflected by the surface S1, and a portion of light penetrates the transparent coating film 316, and then the portion of light is reflected by the surface S2. Moreover, light as well as penetrates the transparent layer 314, and then reflected by the small wavy surface S3 into a direction corresponding to the rough surface. In the in-door or under natural environment, the reel is irradiated with light from various directions owning to reflection and the like. Light reflected by the surfaces of the above-mentioned three portions interfere with one another so that a color is formed. Moreover, experiments result in a fact that the color can visually be recognized from any direction without limitation to a specific direction.

If the transparent layer 314 is not provided, also the thin transparent coating film 316 is formed into a rough shape along the small wavy surface S3. In this case, the formed color generated attributable to the coherence of light reflected by the outer surface and the inner surface of the transparent coating film has poor brightness and thus the color cannot easily visually be recognized though the color can visually be recognized from any direction. However, the present invention having the somewhat thick transparent layer 314 is able to have the smooth surface S2. Therefore, intense brightness can be realized as compared with the structure which is not provided with the transparent layer 314. Thus, a fact was confirmed that the color had intense brightness and thus it was easily visually be recognized. Thus, a luster color was formed.

Also in a case where the surfaces S1 and S2 are formed into smooth waves and the thickness of the transparent coating film 316 is changed, a color can be formed.

Also in a case where a protective clear layer having a thickness of about 10 microns to about 30 microns is formed on the transparent coating film 316, the state of the formed color is not changed considerably and the formed color can visually be recognized. The material of the protective clear layer may be the same as the material forming the foregoing transparent layer 314.

Figure 16:
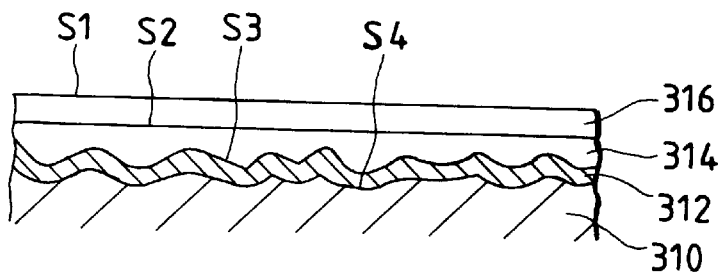
FIG. 16 is a partially enlarged view showing another embodiment of the present invention.
Figure 17:
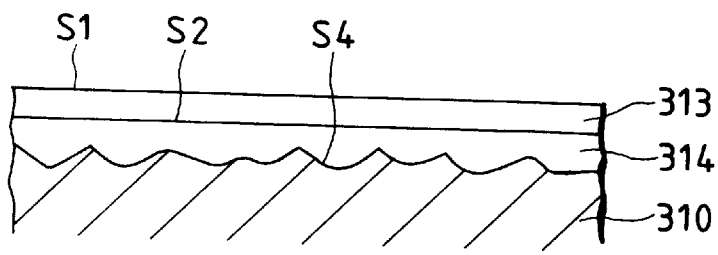
FIG. 17 is an enlarged view showing another embodiment.

FIG. 17 shows a structure in which the article body 310 is made of metal having a rough surface S4 formed into a rough shape. Although the rough shape is formed similarly to the above-mentioned structure, the structure in which the article body 310 is made of metal results in that the opaque metal film 312 shown in FIG. 16 can be omitted. The other structures are the same as those shown in FIG. 16 so that light is reflected by surfaces S1, S2 and S4.

Figure 18:
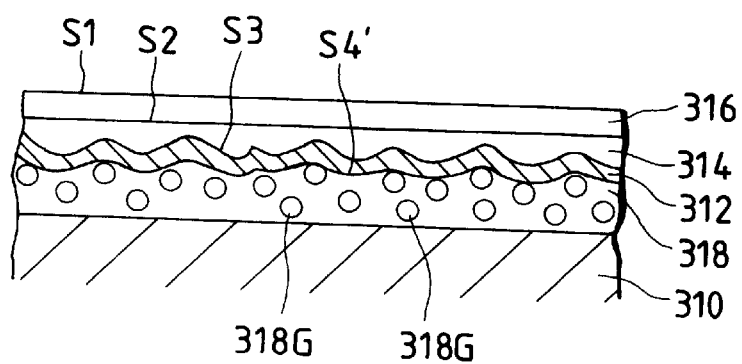
FIG. 18 is an enlarged view showing another embodiment.

FIG. 18 shows a structure in which a coating medium 318 containing small particles 318G is applied to the surface of the article body 310 and the surface S4' is formed into a rough shape. Moreover, an opaque metal film 312 arranged similarly to that shown in FIG. 16 is formed on the surface S4'. In addition, a transparent layer 314 and a thin transparent coating film 316 are formed, similarly to the structure shown in FIG. 16. Light is reflected by the surfaces S1, S2 and S3. The small particles 318G are inorganic particles or organic particles having size of about 1 micron or larger.

Figure 19:
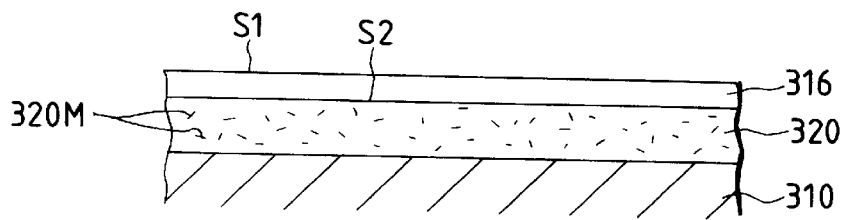
FIG. 19 is an enlarged view showing a another embodiment.

FIG. 19 shows a structure in which a layer 320 (having a thickness about several microns to tens of microns, for example, a thickness about 10 microns) in which a multiplicity of metallic members 320M are mixed with transparent synthetic resin is formed on the surface of the article body 310. Moreover, a thin transparent coating film 216 having a substantially uniform thickness similarly to the above-mentioned structure is formed on the layer 320. The synthetic resin forming the layer 320 may be the same as the material forming the above-mentioned transparent layer 314 or another material. In this case, light is reflected by the surfaces of the metallic members 320M as well as the surfaces S1 and S2. Since reflected light beams interfere with one another, a color is formed. Since the metallic members 320M are directed to various directions, the formed color can visually be recognized from various directions, similarly to the cases shown in FIGS. 16 to 18. Since the surfaces S1 and S2 are smooth surfaces, a bright color can be formed.

Figure 20:
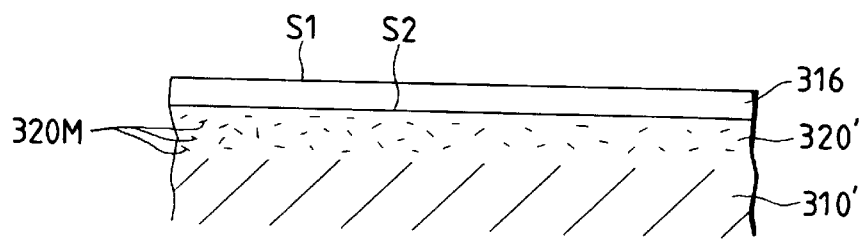
FIG. 20 is an enlarged view showing another embodiment.

In a structure shown in FIG. 20, when the article body 310' is manufactured by injection-molding transparent synthetic resin, it may be molded such that the small metallic members 320M are mixed with the synthetic resin. As an alternative to this, the same may be mixed in only a surface portion 320', as shown in FIG. 20. A thin transparent coating film 316 having a uniform thickness of about 1 micron is formed on the surface portion 320'. Also in this case, light is reflected by the surfaces S1 and S2 and the surfaces of the metallic members 320M. Since reflected light beams interfere with one another, a color is formed. Since the metallic members 320M are directed into a variety of directions, the formed color can visually be recognized from various directions, similarly to the structures shown in FIGS. 16 to 18. Since the surfaces S1 and S2 are smooth surfaces, a bright color can be formed.

Although the description has been performed about the reel, the present invention may be applied another fishing tool or another article, as described above.

As can be understood from the description, according to the present invention, existence of the small wavy surface for reflecting light on the surface of the article or the transparent layer in which the multiplicity of the small metallic members are dispersed enables the color formed attributable to the mutual interference or interaction of light beams with light beams reflected from the two upper reflecting surfaces to be visually recognized from various directions. That is, the formed color can visually be recognized regardless of the direction of the article or the position of a human being and thus the decoration effect can be improved.

Figure 21:
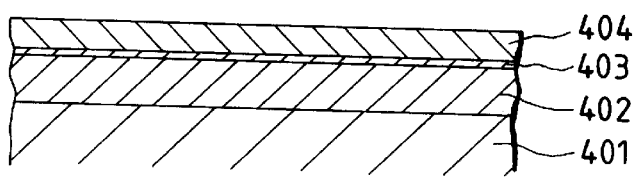
FIG. 21 is a cross sectional view showing another embodiment of a member according to the present invention.

FIG. 21 is a cross sectional view showing an example of a water repellent member which constitutes another embodiment according to the present invention. Referring to the drawing, reference numeral 401 represents a base. An intermediate layer 402 is formed on the base 401. A water repellent layer 404 is formed on the intermediate layer 402. A region 403 exists in the interface between the intermediate layer 402 and the water repellent layer 404.

The material of the base 401 is exemplified by synthetic resin, such as polyamide resin, ABS (acrylonitrile-butadiene-styrene) resin, polycarbonate, polyacetal resin or polyester resin; metal, such as an Al alloy, a Mg alloy, a Ti alloy or stainless steel; ceramics, such as alumina or zirconia; carbon fiber reinforced prepreg; and glass fiber reinforced prepreg.

The intermediate layer 402 may be formed by a coating film, such as a urethane type coating film or an acrylic type coating film; and a metal film, such as an aluminum film, a titanium film or a chrome film; or a metal oxide film, such as a titanium oxide film or a silicon oxide film.

The water repellent layer 404 is exemplified by a layer containing an organic silicon compound and a layer composed of fluorine resin.

It is preferable that the layer containing an organic silicon compound be a layer exhibiting a predetermined water repellent characteristic and containing an organic material which can be applied by a dry plating method. The organic silicon compound is exemplified by polysiloxane, polydimethylsiloxane and the like. The "predetermined water repellent characteristic" means that the angle of contact is 100° or more and a drop angle is 50° or less. As a method for forming the layer containing an organic silicon compound, a dry plating method, such as plasma CVD or PVD (sputtering, vacuum evaporation or ion plating), may be employed. Among the foregoing methods, it is preferable that the plasma CVD or ion plating be employed because their processes can be performed at low temperatures. It is preferable that the thickness of the layer containing the organic silicon compound be 0.01 µm to 0.1 µm in consideration of adhesiveness.

The fluororesin in the layer formed of the fluororesin is exemplified by perfluoropolymer, such as polytetrafluoroethylene; and fluoroalkylacrylate polymer, such as perfluoroalkylacrylate. As a method of forming the layer formed of the fluororesin, a dry plating method, such as plasma CVD or PVD (sputtering, vacuum evaporation or ion plating), may be employed. Among the foregoing methods, it is preferable that the ion plating method be employed because excellent throwing characteristic is obtained even at low temperatures. It is preferable that the thickness of the layer composed of the fluororesin be 0.01 µm to 1 µm in consideration of the durability and weight reduction.

In a case where the water repellent layer 404 is the layer containing the organic silicon compound, for example, a polysiloxane layer, a layer containing a silicon oxide, for example, a silicon oxide film, is employed as the intermediate layer 402. In this case, the layer containing the silicon oxide is used to realize chemical bonding with the layer containing the organic silicon compound. As the layer containing the silicon oxide, a silicon oxide film made of silicon monoxide or silicon dioxide may be employed. The method of forming the layer containing the silicon oxide is exemplified by a physical vapor deposition (PVD) method, a chemical vapor deposition (CVD) method and a sol-gel method. It is preferable that the thickness of the layer containing the silicon oxide be 1 µm or less, more preferably 0.01 µm to 0.1 µm in consideration of the adhesiveness.

The water repellent layer 404, which is a thin film formed by the dry plating method, has a satisfactory water repellent characteristic. Therefore, the water repellent layer according to the present invention is able to exhibit satisfactory water repellent characteristic without enlargement of the weight.

The region 403 constructed of a chemical bond means a region in which a chemical bond is formed between the material forming the base 401 or the intermediate layer 402 and the material forming the water repellent layer 404. The chemical bond means an ion bond, a covalent bond, a bond owning to intermolecular attraction or electrochemical bond and is different from a physical bond having an anchoring effect. For example, the interface between a silicon oxide film (the intermediate layer) and the polysiloxane layer (the water repellent layer) has chemical bonds each of which is formed by a silicon oxide and polysiloxane (—(Si$_2$H$_6$—O)—Si). The region 403 constructed of the chemical bonds above is able to improve the adhesiveness and thus elongate the water repellent life.

Figure 22:
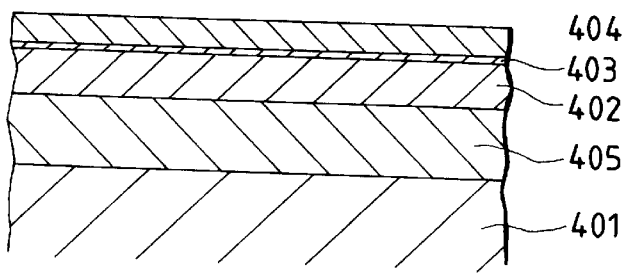
FIG. 22 is a cross sectional view showing another embodiment of a member according to the present invention.

In order to intensify the luster of the exterior, a ground layer 405 having a leveling effect may be formed between the base 401 and the intermediate layer 402, as shown in FIG. 22. In this case, the ground layer 405 may be formed by a coating film made of a urethane coating medium or an epoxy coating medium, a Ni plating film, a Cr plating film or the like. It is preferable that the thickness be 5 µm to 20 µm in consideration of the adhesiveness.

In a case where the intermediate layer 402 is provided, it is preferable that the total thickness of the intermediate layer 402 and the water repellent layer 404 be smaller than 1 µm.

The present invention can be applied to a member, such as a fishing tool, such as a fishing rod, a reel or a lure and a sport tool, such as a golf club or a racket, which must be subjected to the water repellent process.

Examples performed to clarify the effects of the present invention will now be described.

(EXAMPLE 1)

Fiber reinforced prepreg prepared by impregnating epoxy resin in carbon fiber oriented into a specific direction was wound so that a pipe was manufactured. Then, a silicon oxide film having a thickness of 0.08 μm to serve as an intermediate layer was formed on the pipe by ion plating. Then, a polydimethylsiloxane film serving as the layer containing the organic silicon compound and having a thickness of 0.03 μm was formed on the silicon oxide film by ion plating. Thus, a fishing rod which was the water repellent member according to the present invention was manufactured.

The water repellent characteristic of the obtained fishing rod and the ratio of the weight of the water repellent layer with respect to the overall weight were examined. The water repellent characteristic was evaluated in accordance with the angle of contact, while the ratio of the weight of the water repellent layer with respect to the overall weight was calculated in accordance with the difference in the weight changed owning to the process.

As a result, a satisfactory water repellent characteristic was realized, and the ratio of the weight of the water repellent layer with respect to the overall weight was 0.03%.

(EXAMPLE 2)

Fiber reinforced prepreg prepared by impregnating epoxy resin in carbon fiber oriented into a specific direction was wound so that a pipe was manufactured. Then, a titanium oxide film serving as the intermediate layer and having a thickness of 0.03 μm was formed on the pipe by plasma CVD. Then, a perfluoropolymer layer serving as the layer composed of the fluororesin and having a thickness of 0.03 μm was formed on the titanium oxide film by ion plating. Thus, a fishing rod which was the water repellent member according to the present invention was manufactured.

The water repellent characteristic of the obtained fishing rod and the ratio of the weight of the water repellent layer with respect to the overall weight were examined. The water repellent characteristic was evaluated in accordance with the angle of contact, while the ratio of the weight of the water repellent layer with respect to the overall weight was calculated in accordance with the difference in the weight changed owning to the process.

As a result, a satisfactory water repellent characteristic was realized, and the ratio of the weight of the water repellent layer with respect to the overall weight was 0.06%.

(Conventional Example)

Fiber reinforced prepreg prepared by impregnating epoxy resin in carbon fiber oriented into a specific direction was wound so that a pipe was manufactured. Then, a decoration coating layer having a thickness of 20 μm was formed on the pipe by die coating. Then, a water repellent coating layer composed of fluororesin coating medium and having a thickness of 15 μm was formed on the decoration coating layer by spray coating. Thus, a conventional fishing rod having the water repellent coating layer was manufactured.

The water repellent characteristic of the obtained fishing rod and the ratio of the weight of the water repellent layer with respect to the overall weight were examined similarly to the examples. As a result, a satisfactory water repellent characteristic was realized. However, the ratio of the weight of the water repellent layer with respect to the overall weight was 7%.

As described above, the water repellent member according to the present invention has a low ratio of the weight of the water repellent layer with respect to the overall weight, enables the weight to be reduced and permits design of a product without a necessity of considering the thickness of the water repellent layer.

The present invention is not limited to the foregoing embodiments, and a variety of modifications are permitted.

As described above, the water repellent member and the fishing rod according to the present invention comprises a base, a layer formed on the base and containing a silicon oxide and a layer containing an organic silicon compound formed on the layer which contains the silicon oxide. Therefore, the weight of the member can be reduced and design can be performed without a necessity of considering the thickness of the water repellent layer.

What is claimed is:

1. A member for a fishing or sport tool, comprising:

a body of said member;

a first film formed directly on said body of said member or through an intermediate layers, said first film having a first color; and a single-color forming coating film formed on the outside of said first film and having a second color, said single-color forming coating film being at least semi-transparent to allow light to reflect from said first film through said single-color forming coating film;

wherein said single-color forming coating film causes an interference action between said light reflected from said first film and light reflected from said single-color forming coating film to produce a single color independent from either said first and second colors.

2. A member for a fishing or sport tool according to claim 1, wherein said single-color forming coating film is exemplified by one of a physical-vapor deposition method and a chemical vapor deposition method.

3. A member for a fishing or sport tool, comprising:

a body of said member;

an optical reflecting film formed directly on said body of said member or through an intermediate layer so as to cover said body of said member, said optical reflecting film being one of a metal film and a ceramic film and having a first color; and a single-color forming coating film formed on the outside of said film and having a second color, said single-color forming coating film being at least semi-transparent to allow light to reflect from said optical reflecting film through said single-color forming coating film;

wherein said single-color forming coating film causes an interference action between said light reflected from said optical reflecting film and light reflected from said single-color forming coating film to produce a single color independent from either said first and second colors.

4. A member for a fishing or sport tool, according to claim 3, wherein said single-color forming coating film includes at least one thin layer having an optical transparent characteristic.

5. A member for a fishing or sport tool, according to claim 3, wherein said single-color forming coating film is formed by one of at least one transparent layer, at least one semitransparent layer, and the layers combined with a transmission layer and a semitransparent layer.

6. A member for a fishing or sport tool, according to claim 3, wherein said single-color forming coating film includes plural layers which are different in refraction factor from each other.

7. A member for a fishing or sport tool according to claim 3, wherein said single-color forming coating film includes:
   plural optical interference coating films formed on the outside of said body of said member and capable of transmitting or reflecting only components in a wavelength region included in a specific range among incident light beams.

8. A member for a fishing or sport tool, according to claim 7, wherein the thickness of all the plural coating films is 40–500 nm.

9. A member for a fishing or sport tool according to claim 3, wherein said single-color forming coating film is exemplified by one of a physical-vapor deposition method and a chemical vapor deposition method.

10. A member for a fishing or sport tool, comprising:
    a body of said member;
    a film formed directly on said body of said member or through an intermediate layer; and
    a single-color forming coating film formed on the outside of said film and capable of transmitting or reflecting only components in a wavelength region included in a specific range among incident light beams,
    wherein said single-color forming coating film has a thickness defined by the following equation, $(2m+1)\cdot\lambda/4=nd$
    where $\lambda$ is a wavelength, n is a refraction factor, d is said thickness, and m is an integer.

11. A member for a fishing or sport tool, comprising;
    a body of said member;
    a film formed directly on said body of said member or through an intermediate layer, said film having a first color; and
    a single-color forming coating film formed on the outside of said film and having a second color, said single-color forming coating film being at least semi-transparent to allow light to reflect from said film formed directly on said body through said single-color forming coating film;
    wherein said single-color forming coating film causes an interference action between said light reflected from said film formed directly on said body and light reflected from said single-color forming coating film to produce a single color independent from said first and second colors
    wherein said single-color forming coating film has a substantially uniform thickness with a dispersion which is not more than 50 nm.

12. A member for a fishing or sport tool, according to claim 11, wherein said single-color forming coating film includes plural layers which are different in refraction factor from each other.

13. A member for a fishing or sport tool, comprising;
    a body of said member;
    a film formed directly on said body of said member or through an intermediate layer; and
    a single-color forming coating film formed on the outside of said film and capable of transmitting or reflecting only components in a wavelength region included in a specific range among incident light beams,
    wherein said single-color forming coating film has a substantially uniform thickness with a dispersion which is not more than 50 nm; and
    wherein said single-color forming coating film is made of at least one material of $SiO$, $SiO_2$, $In_2O_3$, $TiO_2$, $SnO_2$, $MgF_2$, $Al_2O_3$. $Cr_2O_3$, $ZnS$, $ZrO_2$, $CeO_2$, $Bi_2O_3$, $In_2O_3$, $Fe_2O_3$, $AlF_3$, $BaF_2$, and $CaF_2$.

* * * * *